United States Patent
Finkler et al.

(10) Patent No.: US 6,775,796 B2
(45) Date of Patent: Aug. 10, 2004

(54) CREATION OF MEMORY ARRAY BITMAPS USING LOGICAL TO PHYSICAL SERVER

(75) Inventors: Ulrich A. Finkler, Montrose, NY (US); Gary W. Maier, Poughquay, NY (US); Kevin C. Quandt, St. Albans, VT (US); Robert E. Shearer, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 238 days.

(21) Appl. No.: 09/682,426

(22) Filed: Aug. 31, 2001

(65) Prior Publication Data

US 2003/0046621 A1 Mar. 6, 2003

(51) Int. Cl.[7] ................................................ G11C 29/00
(52) U.S. Cl. ...................................... 714/723; 365/200
(58) Field of Search ................................... 714/724, 718, 714/7, 42, 723; 702/118; 716/4–6; 365/189.07, 185.05, 200

(56) References Cited

U.S. PATENT DOCUMENTS

| | | | |
|---|---|---|---|
| 6,185,707 B1 | 2/2001 | Smith et al. | 714/724 |
| 6,397,373 B1 * | 5/2002 | Tseng et al. | 716/5 |

* cited by examiner

Primary Examiner—Albert Decady
Assistant Examiner—Shelly A Chase
(74) Attorney, Agent, or Firm—McGinn & Gibb, PLLC; Richard M. Kotulak, Esq.

(57) ABSTRACT

A method and system for generating memory array bitmaps is disclosed that uses the memory binary address and failing memory data bits collected during test of a chip as input and translates this input directly to physical location in physical design formats which uses memory and a logical to physical server in an electronic computer aided design system.

20 Claims, 4 Drawing Sheets

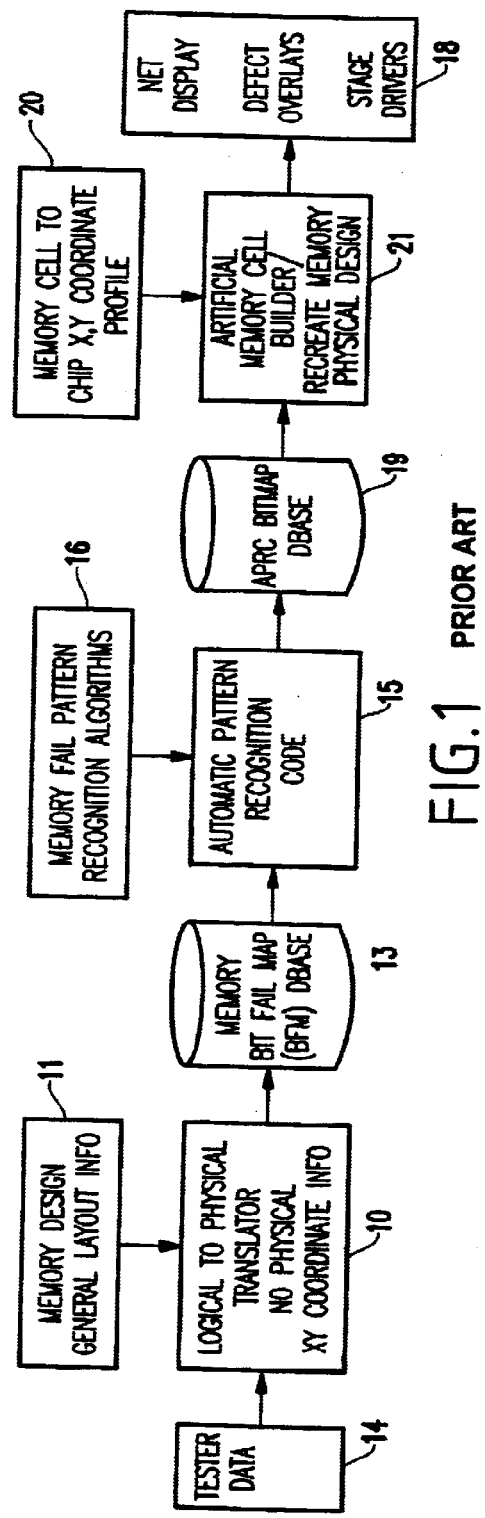
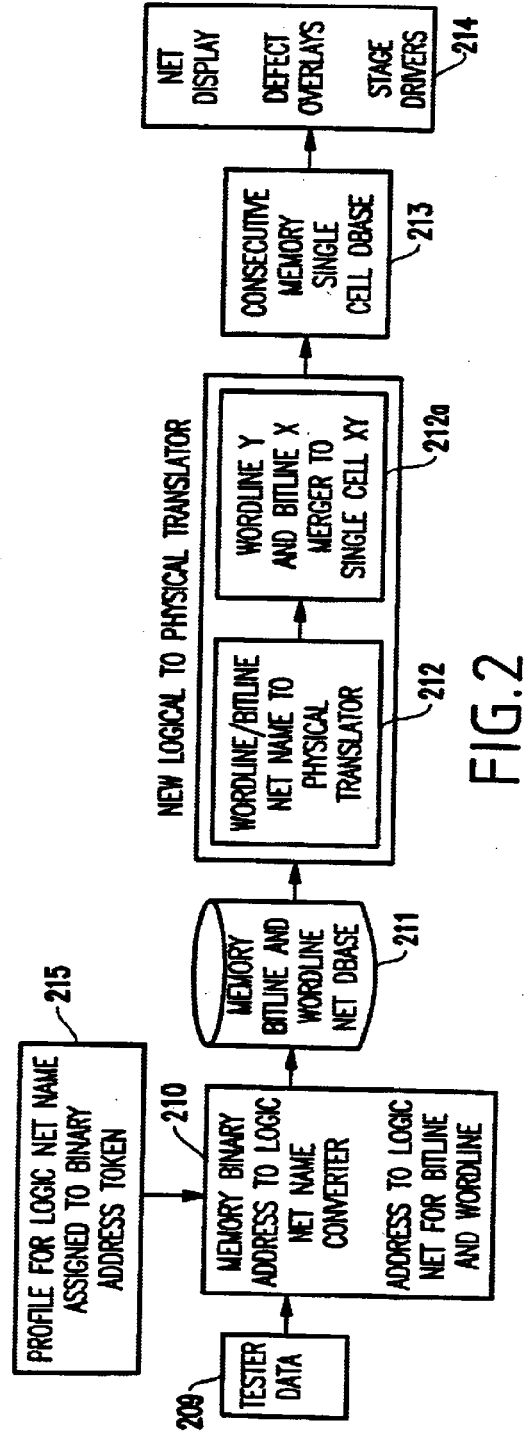
FIG.1  PRIOR ART
FIG.2

CREATION OF MEMORY ARRAY BITMAPS USING LOGICAL TO PHYSICAL SERVER

BACKGROUND OF THE INVENTION

1. Field of the Invention

The present invention relates generally to the field of integrated circuit testing and design, more particularly, to a method and system for creation of memory array bitmaps for an integrated circuit chip design.

2. Description of the Related Art

Present electronic design systems consist of software tools running on a digital computer that assist a designer in the creation and verification of complex integrated circuit (IC) chip designs. Electronic computer-aided design (ECAD) systems are widely used in designing these IC chips. In particular, ECAD systems are used to generate data descriptive of the entire circuit layout as well as the layout of individual circuit cells. Since each cell often contains a large number of circuit elements and interconnections among the elements, ECAD systems have become an indispensable tool in the design of integrated circuits. In addition to generating layout design, some types of ECAD systems generate mask pattern data using circuit layout data. The mask pattern data is used to control various exposure processes necessary for the IC chip's manufacture.

Layout tools forming part of the ECAD systems are used to lay out a chip design onto silicon. The resulting chip layout may be represented in the form of a netlist, i.e., a list of low-level design cells and the interconnections between them. The chip layout may also be represented in the form of a physical design file representing multiple layers of polygons. Once the design is completed, the part is "taped out" (i.e., files representing the chip are written to tape or disk). One format used for such files is the GDSII format. A mask house then makes photomasks to manufacture the chip.

Both memory chips and logic chips require production monitoring and testing. Production monitoring is performed using "in-line" inspection equipment, and production testing is performed using "end-of-line" test equipment. In-line inspection equipment inspects entire semiconductor wafers, each of which may have formed thereon hundreds of chips. End-of-line test equipment performs "binsort functional test" on semiconductor wafers in which the pads of chips are contacted and the chips "exercised." At the conclusion of functional test, parts are "binned" (typically, placed in different categories within an electronic record) according to the test results.

Apart from production testing is failure analysis. Failure analysis attempts to identify the cause of failures of chips of a particular chip design after those failures have been detected during production (or prototype) testing. Failure analysis may typically require more detailed failure information than just a bin code. Detailed failure information is typically obtained by retesting a limited number of packaged parts. These various forms of testing represent tester data.

FIG. 1 represents a current method of logical to physical array bitmap translations 10 for an IC chip that gathers the tester data 14 and detailed design profile data and design algorithms 11 to reproduce the cells and to show their placement relative to each other. This logical to physical conversion has no actual chip physical X,Y coordinates, cell size, spacings or other reference to chip and array origins. After the array bitmap is created for the IC chip, a verification process begins which usually is an iterative process of several changes to the translation code as it relates to the design profiles and algorithms 11 to produce an accurate bitmap, wherein these bitmaps are then compressed and converted to binary formats for storage 13. This data compression process is necessary because of the huge maps of passing and failing cells. After the maps are compressed, a pattern recognition process 15 uses a pattern recognition profile 16 to identify memory fail pattens like Wordline, Bitline, Single Cell Fails, Vertical and Horizontal Pairs, and clusters and partials of these patterns. The automatic pattern recognition section 15 then processes the data to an APRC (automated pattern recognition code) database 19. Still a logical to physical transistor 21 converts the physical map to the actual design coordinates and physical data location. This requires more design data and the creation of another design profile and related algorithms 20 to match shapes to defect overlays 18. In summary, prior processing of array bitmaps requires substantial engineering overhead expense and data storage capacity 13 and 19, has long turn around times, and is prone to human error. Additionally, these maps are typically not directly usable in display tools or for driver tool navigation as used in failure analysis laboratories.

Prior teachings that have attempted to automate this process include U.S. Pat. No. 6,185,707, entitled 'IC test software system for mapping logical functional test data of logic integrated circuits to physical representation.' This disclosure describes how 'logic' net-names are converted to physical shapes for defect overlays but does not describe or provide any way for arrays to be translated and overlayed. Typically logic has test models that create the net names and devices for logic testing which enables an easy logical to physical conversion. Embedded arrays are not supported in the same way. The present U.S. Pat. No. 6,185,707 teaches of ways of determining and displaying X, Y location corresponding to a net name, by translating functional test data of a digital logic chip passed through a simulation model which identifies one or more defective nets of the chip. The defective nets are processed against a database of the foregoing type to obtain X, Y coordinate data for these nets, allowing them to be data logged as physical traces on the chip layout. However, this method is limited to only the logic portions of the chip and provides no way of doing a comparable logical to physical conversion of failing embedded memory cells. Thus, there is need in the IC chip design arts for a method and system that converts failing memory cells to created logic nets and uses multiple nets to create an intersection of the metal shapes to locate a memory cell.

SUMMARY OF THE INVENTION

In view of the foregoing and other problems, disadvantages, and drawbacks of the conventional methods of integrated circuit testing and creation of array bitmaps, the present invention has been devised, and it is an object of the present invention to provide a method and system for automatically creating these bitmaps using a logical to physical server.

To attain the object suggested above, there is provided, according to one aspect of the invention, a method that generates array bitmaps using the binary address and failing data bits collected during test as input and translates this directly to physical location in either GDSII or GL1 physical design formats using the logical to physical server forming part of an ECAD system.

The system of the invention uses the logical to physical data generated during layout versus schematic (LVS) checking of a design. In such a design, every device in the IC chip has a full pin path name to each port on that device. Most, if not all arrays cells today are of standard cell design and their physical layout is very systematic and symmetrical. The wordline and bitline selects physical orientation and direction are also placed to optimize minimal space and maximize performance. The result is that these select lines pass directly over the cell to be selected. This form of layout provides and enables efficient processes to be used during the logical to physical bitmap creation.

The invention maps defects to physical locations of a memory array and logically tests the memory array to produce a binary memory defect address. The invention then converts the binary memory defect address into a logical bitline net name and a logical wordline net name. The invention performs a logical to physical translation on the logical bitline net name to produce a physical bitline net name and performs a logical to physical translation on the logical wordline net name to produce a physical wordline net name. Next the invention merges the physical bitline net name and the physical wordline net name into a single physical location within the memory array.

The binary memory defect address is determined during logical testing of signals output from the memory array. The converting process uses test data and profiles that relate the binary addresses to the logical bitline net name and the logical wordline net name. The merging obtains an X coordinate from the physical bitline net name and a Y coordinate from the physical wordline net name and combines the X coordinate and the Y coordinate to produce the single physical location. The invention stores a series of physical locations relating to a plurality of defects in a database which includes only physical locations of defects in the memory array. The invention also locates a metal shape that is closest to the physical location.

The invention can be applied to many logic and memory circuits, which have many embedded arrays which necessitates volume array fail data collection, efficient and fast bitmap processing, and translation to formats usable by diagnostic and failure analysis tool sets for identification of root cause fail mechanisms. The method of the invention does not require design information gathering and creation of profiles and algorithms for each design. This eliminates the huge engineering overhead, is a standard process for each design, has faster turn around time, is not prone to human error, and generates efficient physical array bitmaps that are usable by downstream overlay, net highlight, and navigation tools. This yields cost competitive designs, as well as enhanced performance and reliability of these designs in the next generation of logic and memory circuits.

BRIEF DESCRIPTION OF THE DRAWINGS

The foregoing and other objects, aspects and advantages will be better understood from the following detailed description of a preferred embodiment(s) of the invention with reference to the drawings, in which:

FIG. 1 is a schematic diagram of conventional logical to physical translation system;

FIG. 2 is a schematic diagram illustrating a preferred detailed embodiment of the invention;

DETAILED DESCRIPTION OF PREFERRED EMBODIMENTS OF THE INVENTION

Figure 3:
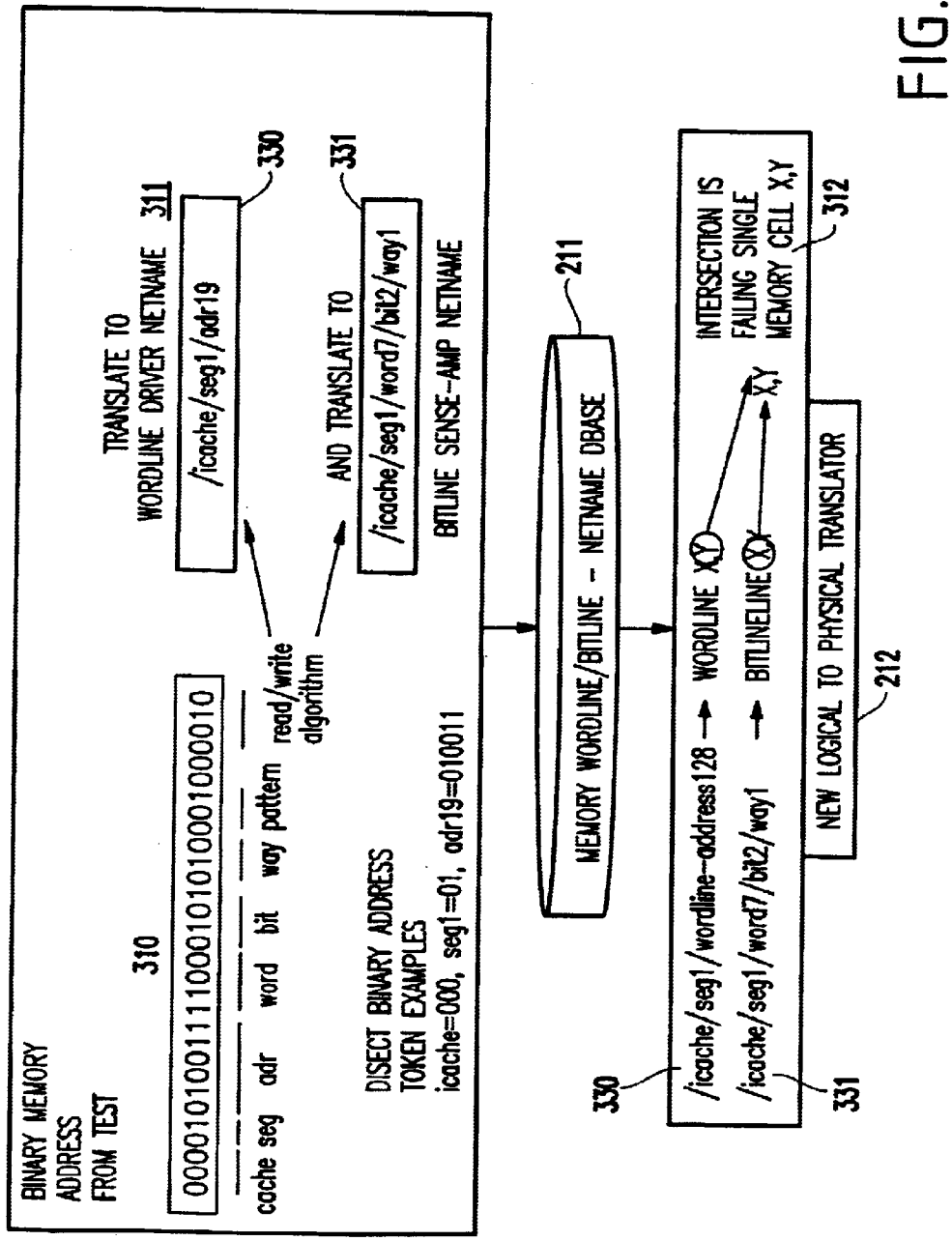
FIG. 3 is a schematic diagram of the invention logical to physical translator.

Referring now to FIG. 2, The invention converts failing memory addresses to similar net names to logic 210. More specifically, the converter 210 uses the tester data 209 and the profile for logic netnames assigned to binary address tokens 215 to convert the memory address to logic netnames for the bitlines and wordlines. This invention identifies the select logic driving the word lines and bitlines that select the memory cell, creates net names similar to failing logic cells and stores them in a database 211. The wordline and bitline drivers and sense amp nets are passed to the logical to physical translator which determines the physical location of each of these nets. The invention then operates translator 212 and merges the X and Y coordinates of each net and creates a single coordinate 212a. Thus, the invention searches for the nearest neighboring metal shape that straps a single memory cell together. Once found, this shapes coordinates are returned for the bitmap of the failing cell. Successive failing memory addresses are done in the same way to build a complete bitmap using design data and stored in a bitmap database 213. The invention saves huge engineering overhead and removes human error when creating embedded memory bitmaps which allows easier use in applications 214.

Figure 4:
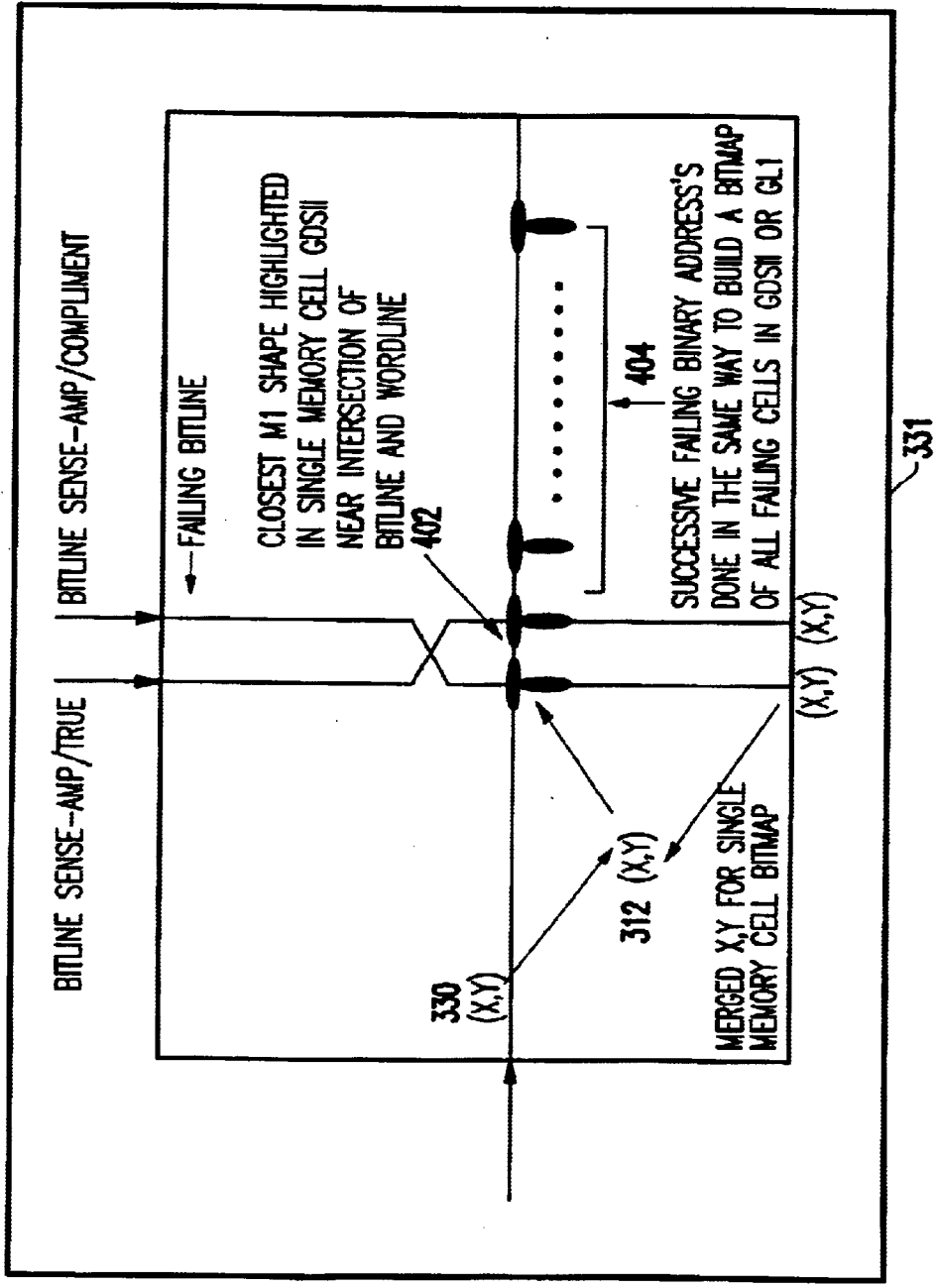
FIG. 4 is a schematic diagram of the physical layout of a portion of an integrated chip.

The invention generates array bitmaps using the binary address and failing data bits 310 collected during testing 209 as an input that first creates 2 logic net names 330, 331 used in the array select logic to select the memory cell as shown in item 311 in FIG. 3. These 2 net names are then translated to physical location in GDSII and/or GL1 physical design formats using the logical to physical server 212, 212a. Once the 2 sets of X, Y coordinates are returned, these coordinates are merged to form a single coordinate. The invention searches the physical design database 211 to look for the nearest metal shape neighbor 402 to that new merged coordinate 312, as shown in FIG. 4. The metal shape returned 402 is the shape that wires the memory cell together. Each individual memory cell contains an identical metal shape. A series of repeating memory cell fails 404 are translated in the same way, to create a complete bitmap 213 of all the failing cells in the memory array.

The invention uses the logical to physical data generated during chip layout versus schematic (LVS) checking of an IC chip design, wherein every device has a full pin path name to each port on that IC device. Most, if not all arrays cells today are of standard cell design and their physical layout is very systematic and symmetrical. The wordline and bitline select circuits physical orientation and direction and are also placed to optimize space and maximize performance. These select lines pass directly over the cell to be selected.

The translator 210 reads binary address data directly from the tester 209, dissects the binary address into each hierarchical level and segment of the array, down to the drivers that drive the wordline and bitline for that failing cell. The net name or pin path name is passed to the logical to physical server 212 with an appropriate application program interface (API) to extract the metal shapes for the failing cell. Generic translation code can be written for use by any design. Each level of binary address is passed to a token. A single, simple, design profile 215 is used that maps the level of hierarchy for that design to the appropriate token. Modifications (212a) are necessary to the existing logical to physical server 212 to extract the X coordinate from the physical shape for the bitline wire and the Y coordinate for the physical shape of the wordline wire and merge them into a single (X, Y) coordinate as shown in FIG. 3. This coordinate is then used to search for the nearest M1 metal shape 402 that straps the devices used to form a single array cell as shown in FIG. 4. These local M1 interconnects are used in each cell, are identical and repeatable, and have a unique (X, Y) coordinate for each cell.

The logical to physical server 212 retrieves that shape and passes it to the translator API which then places it or highlights it in the GDSII or GL1 format. An array bitmap is then built through a series of these retrievals. The end result is an accurate, design data, driven array bitmaps 213 of logical defects of the IC chip that are stored and can be used in multiple downstream ECAD tool sets.

The tester memory data collector 209, retrieves the failing memory addresses as binary data from the tester and formats each failing memory address into a predetermined binary data string which the address to logic net name creator 210 understands. Each portion of the binary address and its where its bit boundary begins and ends 310, is formed into a token that is assigned to a portion of the logical net name of the driver and sense amp selecting that memory cell. This part of the system dissects the binary address into a logic net name for the wordline driver 330 and bitline sense amp 331. These net names 330, 331 are then passed to the logical to physical translator 212. This translator handles the 2 net names 330, 331 and passes these coordinates to the merger 212a, which creates/merges these physical X and Y coordinates into one single coordinate (e.g., the merger 212a takes the Y value from the netname for the wordline 330 and X value from the netname for the bitline 331). This merged coordinate is then passed to the nearest neighbor locator 213 which locates and identifies the failing memory cells physical location and builds a bitmap of all the successive failing memory cells within any memory in a IC chip.

Thus, the inventive translator 212, 212a, reads in the binary address 310 and produces the physical shapes, in their correct physical location within the design. These shapes can be directly loaded into existing stage drivers 214 of tool sets, to defect overlays 214, (i.e., the test data within in-line defect data for correlation to root cause for failure). Additionally, this data can be loaded into existing netlist ECAD navigation display tools 214 (e.g., Merlin Framework CAD navigation tool by Knights Technology of Sunnyvale Calif.), to highlight the physical shapes in the layout or mask view windows. This display tool can take netlist information, layout information, and cross-reference files relating the two and produces a unified database. Such ECAD navigation tools aid in failure analysis and provides the ability to point and click within a circuit layout display and by so doing automatically control a piece of equipment through stage drivers 214. Such equipment includes scanning electron microscopes, focused ion beam devices, and other tools for mask generation, which can readily navigate to the failing cells. ECAD navigation also allows a user to specify the name of a cell, causing the corresponding layout to be displayed.

While the invention is primarily disclosed as a method and a set of software tools, it will be understood by a person of ordinary skill in the art that an apparatus, such as a conventional data processor, including a CPU, memory, I/O, program storage, a connecting bus, and other appropriate components, could be programmed or otherwise designed to facilitate the practice of the method of the invention. Such a processor would include appropriate program means for executing the method of the invention. Also, an article of manufacture, such as a pre-recorded disk or other similar computer program product, for use with a data processing system, could include a storage medium and program means recorded thereon for directing the data processing system to facilitate the practice of the method of the invention. It will be understood that such apparatus and articles of manufacture also fall within the spirit and scope of the invention.

Figure 5:
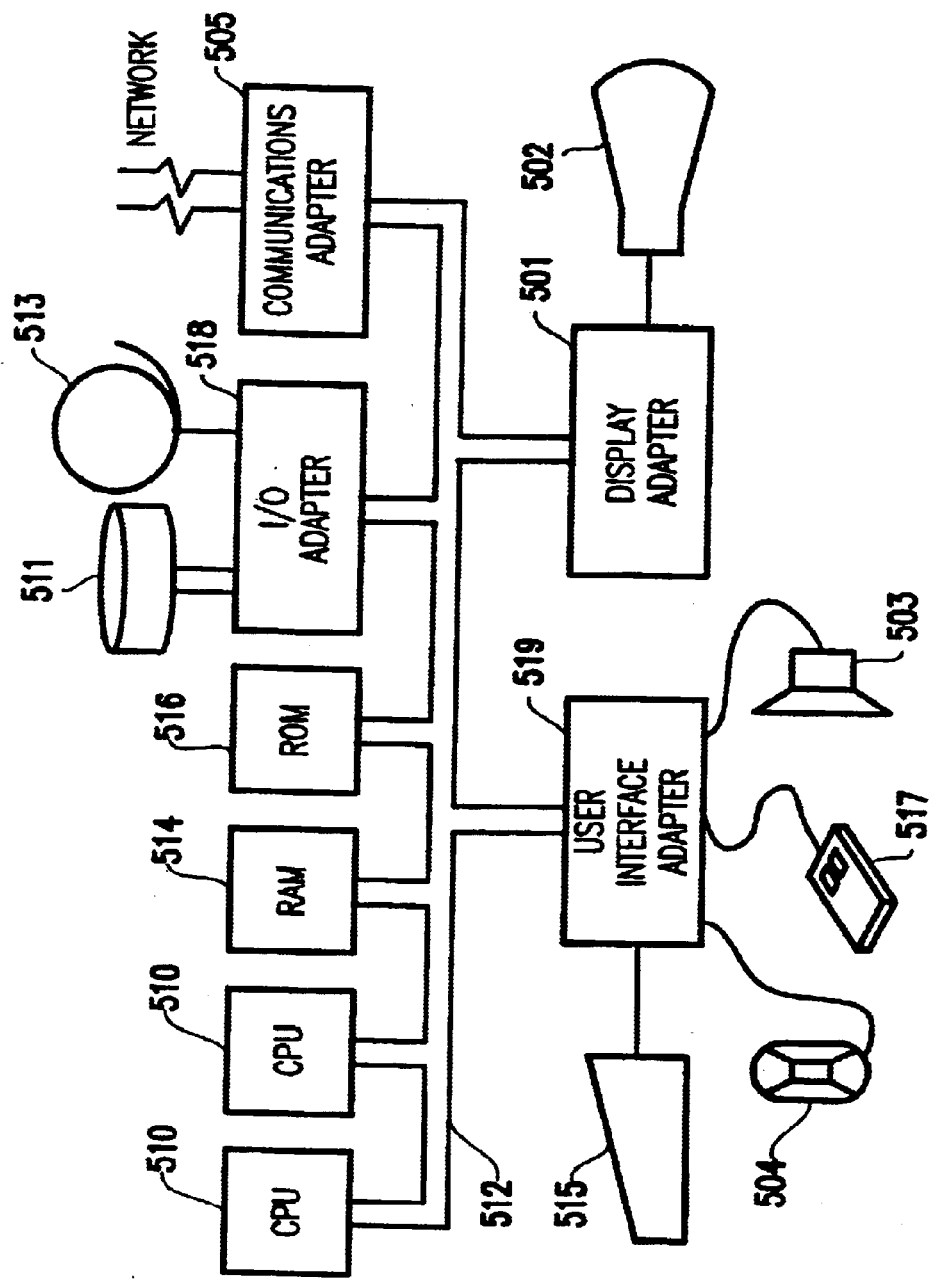
FIG. 5 is an information handling/computer system embodying the present invention.

Referring now to FIG. 5, a representative hardware environment for practicing the present invention is depicted in FIG. 5, which illustrates a typical hardware configuration of an information handling/computer system in accordance with the subject invention, having at least one processor or central processing unit (CPU) 510. CPUs 510 are interconnected via system bus 512 to random access memory (RAM) 514, read-only memory (ROM) 516, an input/output (I/O) adapter 518 for connecting peripheral devices, such as disk units 511 and tape drives 513, to bus 512, user interface adapter 519 for connecting keyboard 515, mouse 517, speaker 503, microphone 504, and/or other user interface devices such as touch screen device (not shown) to bus 512, communication adapter 505 for connecting the information handling system to a data processing network, and display adapter 501 for connecting bus 512 to display device 502. A program storage device readable by the disk or tape units, is used to load the instructions which operate on a wiring interconnect design which is loaded also loaded onto the computer system.

In summary, the invention can be applied to many logic and memory circuits, which have many embedded arrays which necessitates volume array fail data collection, efficient and fast bitmap processing, and translation to formats usable by diagnostic and failure analysis tool sets for identification of root cause fail mechanisms. The method of the invention does not require design information gathering and creation of profiles and algorithms for each design. This eliminates the huge engineering overhead, is a standard process for each design, has faster turn around time, is not prone to human error, and generates efficient physical array bitmaps that are usable by downstream overlay, net highlight, and navigation tools. This yields cost competitive designs, as well as enhanced performance and reliability of these designs in the next generation of logic and memory circuits. This system has other benefits. Only failing data has to be stored in database 213 with no reference to passing data and location. This reduces requirements for bitmap data storage, which is a growing problem with growing memory sizes. In addition, since the bitmap is actually produced by highlighting the physical layout, there is no possibility of error as with the old bitmap methods which re-create shapes and place them based on scaled, estimated, and offset, physical information. This margin of error can no longer be tolerated, with shrinking geometries, when trying to navigate to the failing root cause in Failure Analysis Labs. By highlighting the actual physical design, it is easy to use this data to drive stages in Scanning Electron Microscopes (SEMS), Focused Ion Beam (FIBS), and Probe Stations in FA labs. This reduces the No Defect Found (NDF) rate and speeds production. It is very important to accelerate the Failure Analysis process to generate defect parameters that reflect the true killer defects found in Wafer Final Test (WFT). The art of having Bitmaps generated, 'on the fly', in a physical layout viewer and driving these stages, cannot be underestimated. This invention can be used for any integrated circuit that has memory. Logic with embedded memory, systems on a chip (SOC), dram, sram, ASICS, custom designs, pervasive logic, FPGA's, wired and wireless communications designs, can all use this methodology and invention to improve memory array bitmapping efficiency, reduced data storage requirements, reduce engineering and manufacturing overhead and cost, and decrease turn around time (TAT) and increase productivity in root cause failure analysis.

While the invention has been described in terms of preferred embodiments, those skilled in the art will recognize that the invention can be practiced with modification within the spirit and scope of the appended claims.

What is claimed is:

1. A method of mapping defects to physical locations of memory array, said method comprising:
   converting a binary memory defect address into logic netnames for the corresponding bitlines and wordlines, said netnames comprising a bitline net name and a wordline net name; and
   finding the intersection of said bitline net name and said wordline net name to locate an single physical memory cell within said memory array.

2. The method in claim 1, wherein said binary memory defect address is determined dining logical testing of said memory array.

3. The method in claim 1, wherein said converting uses test data and profiles that relate said binary addresses to said bitline net name and said wordline net name.

4. The method in claim 1, wherein said process of finding said intersection comprises obtaining an X coordinate from said bitline net name and a Y coordinate from said wordline net name and combining said X coordinate and said Y coordinate to produce said single physical location.

5. The method in claim 1, further comprising storing a series of physical locations relating to a plurality of defects in a database.

6. The method in claim 5, wherein said database includes only physical locations of defects in said memory array.

7. The method in claim 1, further comprising locating a metal shape that is closest to said physical location.

8. A method of mapping defects to physical locations of memory array, said method comprising:
   logically testing said memory array to produce a binary memory defect address;
   converting a binary memory defect address into logic netnames for the corresponding bitlines and wordlines, said netnames comprising a bitline net name and a wordline net name;
   performing a logical to physical translation on said logical bitline net name to produce a physical bitline net name and performing a logical to physical translation on said logical wordline net name to produce a physical wordline net name; and
   finding the intersection of said bitline net name and said wordline net name is a to locate an single physical memory cell within said memory army.

9. The method in claim 8, wherein said binary memory defect address is determined during logical testing of signals output from said memory array.

10. The method in claim 8, wherein said convening uses test data and profiles that relate said binary addresses to said logical bitline net name and said logical wordline net name.

11. The method in claim 8, wherein said process of finding said intersection comprises obtaining an X coordinate from said physical bitline net name and a Y coordinate from said physical wordline net name and combining said X coordinate and said Y coordinate to produce said single physical location.

12. The method in claim 8, further comprising storing a series of physical locations relating to a plurality of defects in a database.

13. The method in claim 12, wherein said database includes only physical locations of defects in said memory array.

14. The method in claim 8, further comprising locating a metal shape that is closest to said physical location.

15. A program storage device readable by machine, tangibly embodying a program of instructions executable by the machine to perform a method for mapping defects to physical locations of memory array, said method comprising:
   logically testing said memory array to produce a binary memory defect address;
   converting a binary memory defect address into logic netnames for the corresponding bitlines and wordlines, said netnames comprising a bitline net name and a wordline net name;
   performing a logical to physical translation on said logical bitline net name to produce a physical bitline net name and performing a logical to physical translation on said logical wordline net name to produce a physical wordline net name; and
   finding the intersection of said bitline net name and said wordline net name to locate an single physical memory cell within said memory array.

16. The program storage device in claim 15, wherein said binary memory defect address is determined during logical testing of signals output from said memory array.

17. The program storage device in claim 15, wherein said convening uses test data and profiles that relate said binary addresses to said logical bitline net name and said logical wordline net name.

18. The program storage device in claim 15, wherein said method further comprises obtaining an X coordinate from said physical bitline net name and a Y coordinate from said physical wordline net name and combining said X coordinate and said Y coordinate to produce said single physical location.

19. The program storage device in claim 15, wherein said method further comprises storing a series of physical locations relating to a plurality of defects in a database.

20. The program storage device in claim 15, wherein said database includes only physical locations of defects in said memory array.

* * * * *